United States Patent [19]

Kondo et al.

[11] Patent Number: 5,177,382
[45] Date of Patent: Jan. 5, 1993

[54] ACTIVE FILTER CIRCUIT

[75] Inventors: Hiroshi Kondo; Hiroshi Tanigawa; Tsuneo Tohyama; Isao Fukai, all of Tsurugashima, Japan

[73] Assignee: Toko, Inc., Tokyo, Japan

[21] Appl. No.: 798,215

[22] Filed: Nov. 26, 1991

[30] Foreign Application Priority Data

Nov. 29, 1990 [JP] Japan ................... 2-333136

[51] Int. Cl.⁵ .................... H03B 1/00; H03K 5/00
[52] U.S. Cl. .................... 307/520; 328/167; 330/294; 330/107
[58] Field of Search ........... 307/520, 521; 328/167; 330/107, 109, 85, 294, 293

[56] References Cited

U.S. PATENT DOCUMENTS 4,168,440  9/1979  Gray ........................ 307/520
4,839,542  6/1989  Robinson .................. 307/520
5,001,441  3/1991  Gen-Kuong ............... 330/294

Primary Examiner—Timothy P. Callahan

[57] ABSTRACT

An active filter circuit comprises a differentiator constituted by an operational amplifier having an input terminal and output terminal, and a first integrator constituted by a first capacitor and a first variable conductance amplifier for providing negative feedback to the operational amplifier and a first variable conductance amplifier; and a second integrator constituted by a second capacitor and a second variable conductance amplifier for providing negative feedback to the first integrator. The active filter circuit is arranged such that a damping pole is set up at a predetermined frequency by adjusting operating currents of the first and second variable conductance amplifiers.

2 Claims, 4 Drawing Sheets

5,177,382

ACTIVE FILTER CIRCUIT

BACKGROUND OF THE INVENTION

1. Field of the Invention

This invention relates to an active filter circuit, and more particularly it pertains to a polar filter circuit such as low pass, high pass filter or the like which is constructed in the form of a semiconductor integrated circuit comprising multistage-connected active filters each of which can be arranged such that a damping pole occurs at a predetermined frequency.

2. Description of the Prior Art

Referring to FIG. 1 of the accompanying drawings, there is illustrated a band elimination filter (referred to as BEF hereinafter) which has conventionally been proposed as a filter circuit having a damping pole at a predetermined frequency.

The BEF of FIG. 1 comprises a low pass filter 20, a high pass filter 21, and an adder 22. A signal inputted at an input terminal is passed to the adder via the low pass filter 20 and high pass filter 21, and from an output terminal is derived an output having such frequency characteristics that a damping pole occurs at a predetermined frequency $f_0$ so that the frequency $f_0$ is eliminated.

As will be seen, the conventional BEF is arranged such that between the input and output terminals 1 and 2, the low pass filter 20 and high pass filter 21 are connected in series with the adder 22. However, difficulties have been experienced in an attempt to construct, through a multistage combination of such BEFs, an active filter circuit such as polar low pass or high pass filter provided in the form of a semiconductor integrated circuit or to set up a frequency at which a damping pole occurs, as desired.

Thus, it has been desired to realize a filter circuit with which a damping quantity or the frequency at which a damping pole occurs, can be set up as desired, and an active filter circuit which is arranged such that a polar filter circuit such a low pass or high pass filter provided in the form of a semiconductor integrated circuit, can be constructed by connecting in multistage the above type of filter circuit.

SUMMARY OF THE INVENTION

The present invention has been made from the above-mentioned standpoint, and has for an object to provide a polar type active filter circuit which is well adapted for construction in the form of a semiconductor integrated circuit.

According to an aspect of the present invention, there is provided an active filter circuit including a differentiator comprising an operational amplifier having an input terminal and output terminal, and a first integrator constituted by a first capacitor and a first variable conductance amplifier for providing negative feedback to the operational amplifier and a first variable conductance amplifier; and a second integrator constituted by a second capacitor and a second variable conductance amplifier for providing negative feedback to the first integrator.

As will be appreciated, the active filter circuit according to the present invention has a transfer function represented by $(sC_1/gm_1 + gm_2/sC_2)$ where $sC_1/gm_1$ and $gm_2/sC_2$ represent the transfer function of a differentiator and that of an integrator respectively, the active filter circuit being arranged such that an operational amplifier having a substantially infinite gain is provided with multi-feedback by an integrator comprising a variable conductance amplifier so that no adder is required. Thus, the active filter embodying the present invention is simplified in circuit arrangement and can easily be constructed in the form of a semiconductor integrated circuit.

A further advantage of the present invention is that by connecting such active filter circuits in multistage, it is possible to provide a polar active filter circuit, such as low pass or high pass filter, constructed in the form of a semiconductor integrated circuit.

A still further advantage of the present invention is that with the active filter circuit according to the present invention, because of the fact that each of the integrators includes a variable conductance amplifier, shift of the damping pole and/or adjustment of the damping quantity can readily be achieved simply by adjusting the operating current of the variable conductance amplifier to change the transconductance thereof.

Other objects, features and advantages of the present invention will become apparent from the ensuing description taken in conjunction with the accompanying drawings.

DESCRIPTION OF THE PREFERRED EMBODIMENTS

Figure 1:
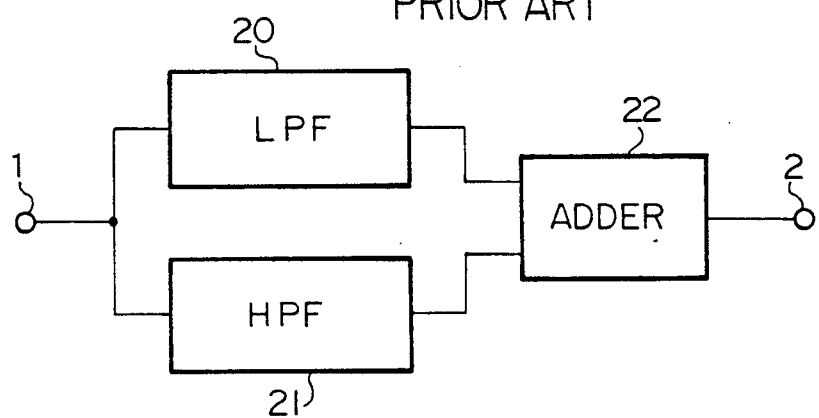
FIG. 1 is a circuit diagram illustrating an example of a conventional BEF.
Figure 2:
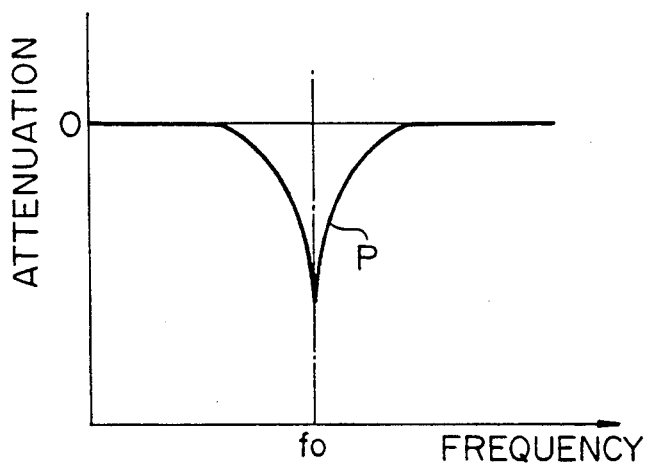
FIG. 2 is a view showing the frequency characteristics of the conventional BEF.
Figure 3:
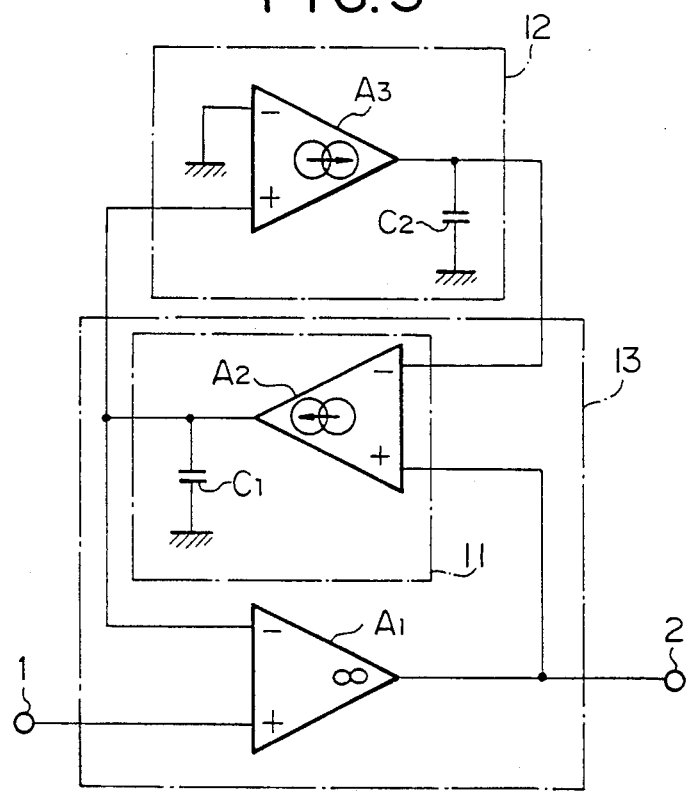
FIG. 3 is a circuit diagram showing the active filter circuit according to a first embodiment of the present invention.

Referring to FIG. 3, there is shown a circuit diagram of the active filter circuit according to a first embodiment of the present invention, wherein an input terminal 1 is connected to the non-inverting input terminal of an operational amplifier $A_1$ having a substantially infinite gain, and an output terminal is led out of the output terminal 2 of the operational amplifier $A_1$. The output terminal of the operational amplifier $A_1$ is coupled to the non-inverting input terminal of a variable conductance amplifier $A_2$, the output terminal of which is connected to one end of a capacitor $C_1$ grounded at the other end, and also to the inverting input terminal of the operational amplifier $A_1$. The variable conductance amplifier $A_2$ constitutes, together with the capacitor $C_1$, an integrator 11. The operational amplifier $A_1$ is provided with negative feedback by the integrator and forms, together with the integrator, a differentiator 13. Further, the output terminal of the variable conductance amplifier $A_2$ is connected to the non-inverting input terminal of a variable conductance amplifier $A_3$, the output terminal of which is coupled to one end of a capacitor $C_2$ grounded at the other end and also to the inverting input terminal of the variable conductance amplifier $A_2$. The variable conductance amplifier $A_3$ constitutes, together with the capacitor $C_2$, an integrator 12. The inverting input terminal of the variable conductance amplifier $A_3$ is grounded.

As will be appreciated, the active filter according to the present invention, which is constructed in the form of a negative feedback circuit, has such frequency characteristics that a damping pole occurs at a predetermined frequency, i.e., at a point where the characteristic curve of a low pass filter crosses that of a high pass filter.

The transfer function of the active filter circuit according to the present invention is given as a sum of the transfer function of the integrator 12 and that of the differentiator 13. More specifically, assuming that the transfer functions of the differentiator and integrator are represented by $sC_1/gm_1$ and $gm_2/sC_2$ respectively, the transfer function of the active filter circuit according to the present invention is given as follows:

$$V_2/V_1 = sC_1/gm_1 + gm_2/sC_2 \tag{1}$$

where $V_1$ is an input voltage, $V_2$ is an output voltage, and $gm_1$ and $gm_2$ are the transconductance of the variable conductance amplifiers $A_1$ and $A_2$ respectively.

An attempt will now be made to derive the above equation (1) based on the block diagrams of FIGS. 4 to 7.

Figure 4:
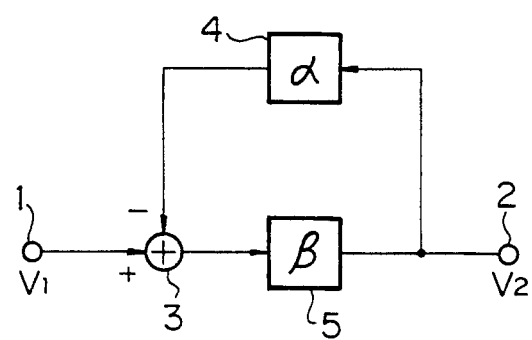
FIGS. 4 to 7 are block diagrams useful for explaining about the active filter circuit according to the present invention.
Figure 5:
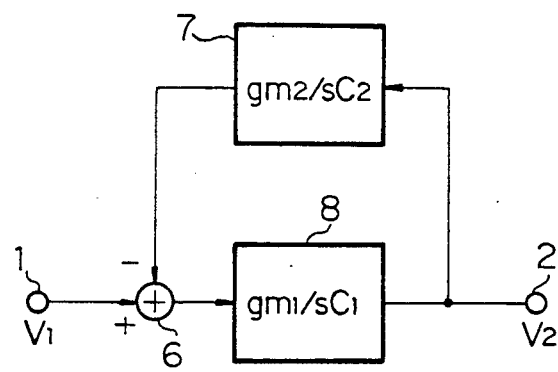
Figure 6:
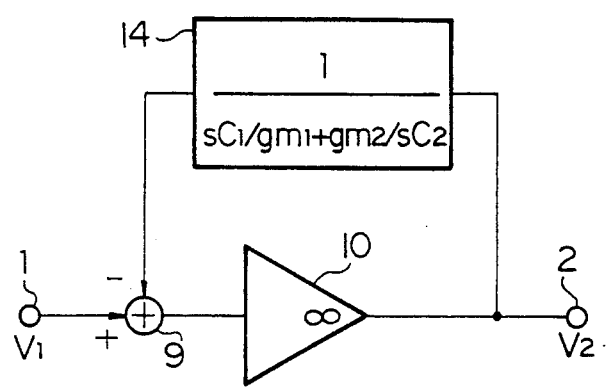
Figure 7:
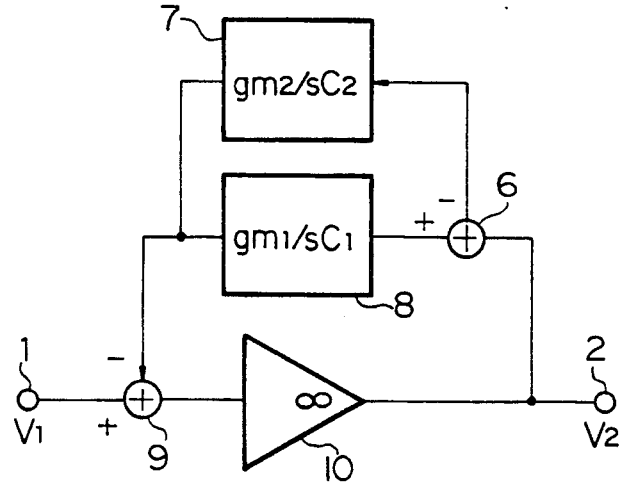

FIG. 4 is a block diagram illustrating a common negative feedback circuit comprising an adder 3, and blocks 4 and 5. FIG. 5 is a block diagram wherein an integrator having a predetermined transfer function is provided in each of blocks 7 and 8 which correspond to the blocks 4 and 5 of FIG. 4 respectively. FIG. 6 illustrates an arrangement in which blocks 10 and 14 corresponding to the blocks 4 and 5 of FIG. 4 are constituted by an operational amplifier having an infinite gain and a block having a predetermined transfer function, respectively. FIG. 7 is a block diagram showing the active filter circuit according to the present invention, which is constituted by the blocks of FIGS. 5 and 6.

Since the arrangement of FIG. 4 is a common negative feedback circuit, the transfer function thereof can be expressed as follows:

$$(V_1 - \alpha V_2)\beta = V_2 \tag{2}$$

where $\alpha$ is the variable of the block 4, and $\beta$ is the variable of the block 5.

Thus, from the equation (2), the transfer function of the block diagram shown in FIG. 4 is given as follows:

$$V_2/V_1 = 1/(\alpha + 1/\beta) \tag{3}$$

In the block diagram of FIG. 4, let it be assumed that the variables $\alpha$ and $\beta$ of the blocks 4 and 5 are substituted with integrator transfer functions, i.e., $gm_2/sC_2$ and $gm_1/sC_1$ as shown below:

$$\alpha = gm_2/sC_2 \tag{4}$$

$$\beta = gm_1/sC_1 \tag{5}$$

Then, the block diagram of FIG. 4 can be transformed to the block diagram of FIG. 5 comprising blocks 7 and 8. Thus, by substituting the equations (4) and (5) for the equation (3), the transfer function can be expressed as follows:

$$V_2/V_1 = 1/(sC_1/gm_1 + gm_2/sC_2) \tag{6}$$

Further, the variables $\alpha$ and $\beta$ of the blocks 4 and 5 in the block diagram of FIG. 4 are rewritten as follows:

$$\alpha = 1/(sC_1/gm_1 + gm_2/sC_2) \tag{7}$$

$$\beta = \infty \tag{8}$$

The resulting block diagram turns out to be as shown in FIG. 6, the transfer function of which is given as follows, by substituting the equations (7) and (8) for the variables $\alpha$ and $\beta$ in the equation (3):

$$V_2/V_1 = sC_1/gm_1 + gm_2/sC_2 \tag{9}$$

From the equation (9), it will be seen that the block diagram of FIG. 6 provides a transfer function which is equivalent to one obtained by adding up the characteristics of the differentiator and integrator such as represented by the equation (1).

Since the transfer function of the block 14 of FIG. 6 is $1/(sC_1/gm_1 + gm_2/sC_2)$, which is identical with the transfer function represented by the equation (6). Thus, by combining the block diagrams of FIGS. 5 and 6, the transfer function of the equation (9) can be illustrated as in the block diagram of FIG. 7.

It is verified from FIG. 7 that the present active filter circuit shown in FIG. 3 is constituted by a differentiator 13 comprising an operational amplifier $A_1$ having an infinite gain, and an integrator 11 having a transfer function of $gm_1/sC_1$ and providing feedback to the operational amplifier $A_1$; and an integrator 12 having a transfer function of $gm_2/sC_2$ and providing feedback to the integrator 11, and that the adder 9 may be achieved simply by coupling the feedback output to the inverting input terminal of the operational amplifier $A_1$.

Figure 8:
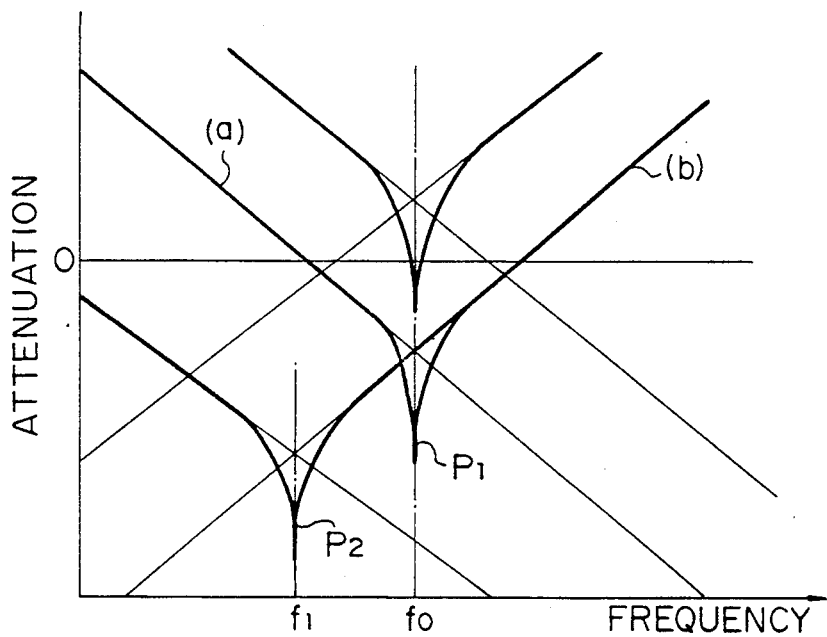
FIG. 8 is a view illustrating the frequency characteristics of the active filter circuit according to the present invention.

FIG. 8 illustrates the damping pole of the present active filter, which occurs at a point where the filter characteristic curves (a) and (b) of the low pass and high pass filters, i.e., the integrator and differentiator, when combined, cross each other. It is possible to shift the damping pole by adjusting the operating currents of the variable conductance amplifiers $A_2$ and $A_3$ so as to set up the transconductances thereof. By adjusting the operating current of the variable conductance amplifier $A_3$ constituting the integrator 12, for example, it is possible to cause the damping pole to be shifted from $P_1$ at a frequency $f_0$ to $P_2$ at a frequency $f_1$. Further, by adjusting the operating currents of the variable conductance amplifiers $A_2$ and $A_3$ constituting the integrators 11 and 12 respectively at the same time and in the same direction, it is possible to change the damping quantity alone, while keeping the damping pole at the predetermined frequency $f_0$.

Figure 9:
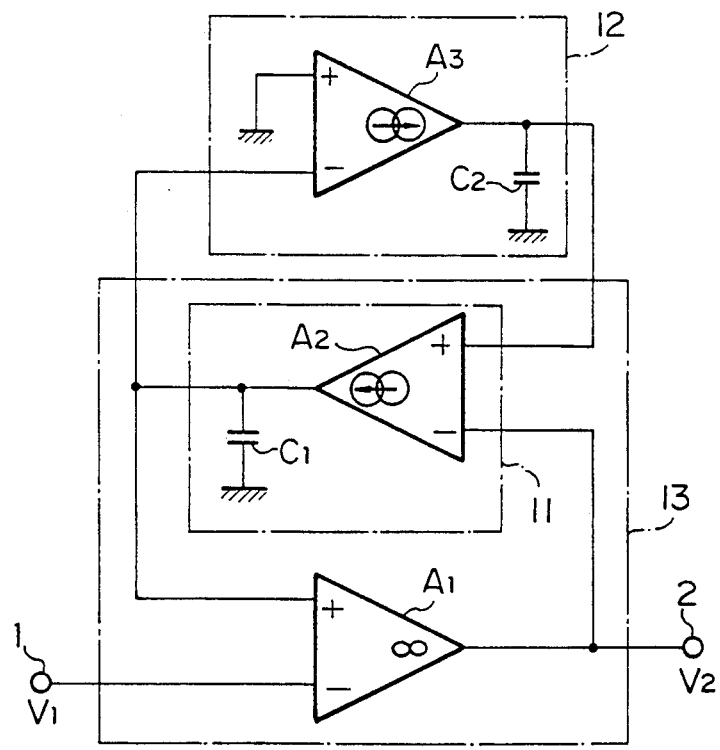
FIG. 9 is a circuit diagram showing the active filter circuit according to a second embodiment of the present invention.

FIG. 9 is a circuit diagram illustrating the active filter circuit according to a second embodiment of the present invention.

The embodiment of FIG. 9 is different from that of FIG. 3 in that the operational amplifier $A_1$ is an inverting type operational one and the variable conductance amplifiers are also of the inverting type. In FIG. 9, elements corresponding to those of FIG. 3 are indicated by like references, and a further description thereof will be omitted.

As will readily be appreciated, the transfer function of the active filter circuit of FIG. 9 according to the second embodiment of the present invention is given as follows:

$$V_2/V_1 = -(sC_1/gm_{gm2}/sC_2)$$

While the specific embodiments of the present invention have been illustrated and described above, it is to be understood that the present invention is by no means limited thereto but encompasses all changes and modifications which will become possible within the scope of the appended claims.

We claim:

1. An active filter circuit comprising:

a differentiator constituted by an operational amplifier having a non-inverting and an inverting input terminal and an output terminal, and a first integrator constituted by a first capacitor and a first variable conductance amplifier having a non-inverting and an inverting input terminal and an output terminal, said integrator being arranged to provide negative feedback to said operational amplifier; and a second integrator constituted by a second capacitor and a second variable conductance amplifier having a non-inverting and an inverting input terminal and an output terminal, said second integrator being arranged to provide negative feedback to said first integrator;

said active filter circuit being arranged such that a damping pole is set up at a predetermined frequency by adjusting operating currents of said first and second variable conductance amplifiers, an input terminal connected to said non-inverting input terminal of said operational amplifier, and a output terminal which is led out of the output terminal of said operational amplifier; wherein in said differentiator, the output terminal of said operational amplifier is connected to the non-inverting input terminal of said first variable conductance amplifier, the output terminal of said first variable conductance amplifier being connected to the inverting input terminal of said operational amplifier and also to the non-inverting input terminal of said second variable conductance amplifier, said first capacitor being connected at one end to the output terminal of said first variable conductance amplifier; and wherein in said second integrator, the output terminal of said second variable conductance amplifier is connected to the inverting input terminal of said first variable conductance amplifier, the inverting terminal of said second variable conductance amplifier being grounded, said second capacitor being connected to one end to the output terminal of said second variable conductance amplifier and grounded at the other end.

2. An active filter circuit comprising:

a differentiator constituted by an operational amplifier having a non-inverting and an inverting input terminal and an output terminal, and a first integrator constituted by a first capacitor and a first variable conductance amplifier having a non-inverting and an inverting input terminal and an output terminal, said integrator being arranged to provide negative feedback to said operational amplifier; and a second integrator constituted by a second capacitor and a second variable conductance amplifier having a non-inverting and an inverting input terminal and an output terminal, said second integrator being arranged to provide negative feedback to said first integrator;

said active filter circuit being arranged such that a damping pole is set up at a predetermined frequency by adjusting operating currents of said first and second variable conductance amplifiers, and an input terminal is connected to the inverting input terminal of said operational amplifier, and an output terminal is led out of the output terminal of said operational amplifier; wherein in said differentiator, the output terminal of said operational amplifier is connected to the inverting input terminal of said first variable conductance amplifier, the output terminal of said first variable conductance amplifier being connected to the non-inverting input terminal of said operational amplifier and also to the inverting input terminal of said second variable conductance amplifier, said first capacitor being connected at one end to the output terminal of said first variable conductance amplifier; and wherein in said second integrator, the output terminal of said second variable conductance amplifier is connected to the non-inverting input terminal of said first variable conductance amplifier, the non-inverting terminal of said second variable conductance amplifier being grounded, said second capacitor being connected at one end to the output terminal of said second variable conductance amplifier and grounded at the other end.

* * * * *